United States Patent
Stalzer

(10) Patent No.: US 6,175,815 B1
(45) Date of Patent: *Jan. 16, 2001

(54) STORAGE REDUCTION METHOD FOR FAST MULTIPOLE FIELD CALCULATIONS

(75) Inventor: Mark A. Stalzer, Agoura, CA (US)

(73) Assignee: Hughes Electronics Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/041,239

(22) Filed: Mar. 12, 1998

(51) Int. Cl.[7] ....................................................... G06G 7/48
(52) U.S. Cl. .................................................... 703/5; 703/4
(58) Field of Search .......................... 395/500.26; 703/5, 703/4

(56) References Cited

U.S. PATENT DOCUMENTS

| | | | |
|---|---|---|---|
| 5,313,611 | * 5/1994 | Franklin et al. | 711/206 |
| 5,424,963 | * 6/1995 | Turner et al. | 395/500.27 |
| 5,559,718 | * 9/1996 | Baisuck et al. | 395/500.06 |

OTHER PUBLICATIONS

Engheta et al.: The fast multipole method (FMM) for electromagnetic scattering problems; IEEE Trans. Antennas and Propagation; vol. 40; pp. 634–641, Jun. 1992.*

Richardson: Exploiting trivial and redundant computation; IEEE: 11th Symp. on Computer Arithmetic; pp. 220–227, Jul. 1993.*

Urankar et al.: Compact extended algorithms for elliptic integrals in electromagnetic field and potential computations. II. Elliptic integral of third kind with extended untegration range.; vol. 30; pp. 1236–1241, May 1994.*

Harrington, R.F., "*Field Computations by Moment Methods*" IEEE Antennas and Propagation Society pp. 1–21., MacMillan, New York, NY, 1968.

Coifman, R., et al. "*The Fast Multipole Method for the Wave Equation: A Pedestrian Presciption*" IEEE Antennas and Propagation Magazine, vol. 35, No. 3, Jun. 1993, 1992, pp. 7–12.

Rokhlin, V. "*Rapid Solution of Integral Euqations of Classical Potential Theory*" Journal of Computation Physics, vol. 60, No. 2, Sep. 15, 1995, pp. 187–207.

Stalzer, M. "*Parallelizing the Fast Multipole Method for the Helmholtz Equation*" Optical Physics Laboratory, Hughes Research Laboratories, pp.325–330., Feb. 1995, Proc. of the Seventh SIAM Conference, Feb. 1995, pp. 325–330.

Stalzer, M. "*A Parallel Fast Multipole Method For The Helmholtz Equation*" pp. 263–274, Parallel Processing Letter 5, 1995.

Rokhlin, V., et al. "*Scalability of the Fast Multiple Method for the Helmholtz Equation*" Eighth SIAM Conference on Parallel Processing, pp. 1–8 Mar. 14, 1997.

* cited by examiner

Primary Examiner—Kevin J. Teska
Assistant Examiner—Hugh Jones
(74) Attorney, Agent, or Firm—V. D. Duraiswamy; M. W. Sales

(57) ABSTRACT

A method for efficiently storing quantities used by the Fast Multipole Method (FMM) to perform field calculations is disclosed. This method takes advantage of the level structure used by the FMM. The disclosed method selects a particular level and, for each group in that level, calculates interactions with all far groups. The disclosed method does not repeat calculations for interaction of a similar distance for the same level. Rather, it references calculations previously made for the similar interaction, thereby eliminating the calculation and storage of information that is the same as information previously calculated and stored.

13 Claims, 8 Drawing Sheets

STORAGE REDUCTION METHOD FOR FAST MULTIPOLE FIELD CALCULATIONS

STATEMENT OF RIGHTS OWNED

This invention was made with government support under Agreement No. MDA972-95-C-0021 awarded by ARPA. The government has certain rights in this invention.

BACKGROUND OF THE INVENTION

1. Field of the Invention

The present invention relates in general to electromagnetic scattering calculations. More specifically, it relates to an efficient method for storing quantities used by the Fast Multipole Method (FMM) to perform field calculations.

2. Description of Related Art

When electromagnetic energy is incident on a conductive material, surface currents are induced on the object being irradiated. These surface currents radiate electromagnetic energy that can be detected and measured. This is the basic principle by which radar detection systems work.

Referring to FIG. 1, an object, referred to as a scatterer S, is shown. The scatterer S represents any three-dimensional conductive object that can be irradiated with plane waves of electromagnetic energy. $P_1$ to $P_N$ represent N different plane waves that irradiate the scatterer. $Q_1$ to $Q_N$ represent radiated energy from the scatterer resulting from the surface currents induced on the object by the irradiating plane waves. This energy from the scatterer S is also known as scatter or scattering amplitude. The scattering amplitude is the ratio of the reflected (or scattered) energy to the incident energy. For many applications it is necessary to irradiate the scatterer S from many different angles on many different sides, often referred to as look angles or right hand sides, when measuring scattering amplitude.

Scattering amplitude measurements are useful in a variety of applications such as circuit and antenna modeling. However, the most common use of electromagnetic scattering is in radar systems. Radar systems rely on the principle that all conductive objects re-radiate incident electromagnetic energy in patterns that are dependent on that object's particular size, shape and other physical characteristics. In other words, all objects possess "electromagnetic fingerprints." Once the scatter information of an object has been thoroughly determined in all directions, this information can be used to identify that object. Many defense-related aircraft are designed to produce as little scatter as possible in order to minimize the likelihood of the aircraft being detected by an enemy radar system.

The electromagnetic scatter of an object can be determined by empirical methods or by simulation/computation methods. Empirical methods can be costly and time consuming to implement. For example, making scatter measurements is time consuming because the scatterer must be characterized in both the horizontal and the vertical planes. In other words, the scattering characteristics of the scatterer must be known from any point in space surrounding the object. Additionally, empirical scatter measurements are typically made from an actual scatterer by placing the scatterer on a table that rotates during the measurements. When the scatterer is a large and/or expensive object such as an aircraft, the expense associated with conducting such measurements can be readily appreciated.

Computational methods use mathematical models to determine the scattering characteristics of a given object, thus eliminating the need to actually construct and test the object. In general, computational methods resolve an irradiating source into surface currents on the scatterer. Once the surface currents are known, the re-radiated field from the scatterer can be computed. Conventional computational methods break the scatterer into N small cells (unknowns) for computational analysis. A higher number of unknowns results in a more precise simulation, but also requires increased computational power.

FIG. 2 is a two-dimensional cross section of a three-dimensional scatterer S broken into N different cells. The cells are denoted by numbers such as n=1, n=2, etc. Accordingly, each cell shown as a square in FIG. 2 is actually a cube having a depth in the y direction equal to the cell height in the z direction and the cell width in the x direction. Additionally, not shown in FIG. 2 are cells located behind the cells shown. For example, located in the y direction behind cell n=1 is a stack of cells that cannot be shown in the two-dimensional drawing in FIG. 2.

One method of calculating the characteristics of a scatterer is the Fast Multipole Method (FMM). FMM segments a scatterer into a number of cells as shown in FIG. 2. However, preferably the FMM groups the N cells in a hierarchical fashion. That is, the smallest groups of cells in FIG. 2 represent level 0 of a hierarchical structure and levels 1 and 2 represent higher levels in the hierarchical structure. For example as shown in FIG. 3, eight level 0 cells are grouped into a single level 1 group. Similarly, eight level 1 groups, or sixty-four level 0 cells, may be grouped into a single level 2 group. With reference to FIG. 2, hierarchical grouping results in cells n=1 to n=16 being grouped together into a single level 2 group. This cubic grouping structure is not limited to three group levels. Rather, the number of levels is limited by the size of the level 0 cells and the physical size of the scatter under analysis.

Collecting the scatterer cells into groups allows for the decomposition of the impedance matrix Z into sparse components Z', V, and T such that Equation 1 holds.

$$Z \approx Z' + V T V \dagger \qquad (1)$$

Equation 1 represents the impedance for a single level of groups. Multiple level groupings use recursive decompositions. However, even though recursive decomposition is used in multiple level systems, the translation operators for the interactions maintain the same form. Fields due to currents within a group m are tabulated at K points, or far-field directions, on a unit sphere. In Equation 1, T is the translation operator, which serves to translate tabulated fields between groups that are far from one another. At a given group, the translated fields from all far away groups are summed and used to compute the interactions on the current elements within the given group. For interactions due to groups nearby a given group, a sparse portion Z' of the regular impedance matrix is used. The variables used in Equation 1 can all be calculated from Equations 2–4.

$$T_{mm'k} = \sum_{l=0}^{L} i^l (2l+1) h_l^{(1)}(k_0 X_{mm'}) P_l(\hat{k} \cdot \hat{X}_{mm'}) \qquad (2)$$

In Equation 2, the number inserted for the variable L depends on the desired accuracy, $\hat{k}$ is the unit vector in the kth far field direction, $\hat{X}_{mm'}$ is the unit vector from the center of the group m to group m' and $h_l^{(1)}$, $P_l$, and $k_o$ are the Hankel function, the Legendre polynomial, and the wave number, respectively.

$$V_{nk} = e^{ik \cdot (xn - Xm)} \qquad (3)$$

$$Z'_{nn'} = G(r) \quad (4)$$

In Equations 3 and 4, $x_n$ is the location of the unknown n, $X_m$ is the center of the group m that contains n, $r=|x_n-x_{n'}|$ for unknowns n, n' in nearby groups, and $G(r)$ is the Green function.

Additional details regarding FMM can be found in the following documents: R. F. Harrington, Chapter 1 of *Field Computation By Moment Methods*, MacMillian, New York, N.Y., 1968; R. Coifman, V. Rokhlin, and S. Wandzura, *The Fast Multipole Method: A Pedestrian Prescription*, IEEE Antennas and Propagation Society Magazine, June 1993, pages 7–12; V. Rokhlin, *Rapid Solution Of Integral Equations Of Classical Potential Theory*, J. Comp. Phys., 60 (1985), pages 187–207; M. A. Stalzer, *Parallelizing The Fast Multipole Method For The Helmholtz Equation*, Proceedings of the Seventh SIAM Conference on Parallel Processing for Scientific Computing, February 1995, pages 325–330; and M. A. Stalzer, *A Parallel Fast Multipole Method For The Helmholtz Equation*, Parallel Processing Letter, 5 (1995), pages 263–274. The entire disclosure of each of the above-listed documents is incorporated herein by reference.

For large simulations the storage of the translation operators, as calculated by Equation 2, is cumbersome. For example, simulations having roughly 100,000 unknowns requires approximately 190 Megabytes (MB) of storage space to store the translation operators in the form $T_{mm'k}$. The problem of storing such extensive volumes of data can be readily appreciated.

SUMMARY OF THE INVENTION

A method for efficiently storing quantities used by the Fast Multipole Method (FMM) to perform field calculations is disclosed. This method takes advantage of the level structure used by the FMM. The method selects a particular level and, for each group in that level, calculates interactions with all far groups. The method does not repeat calculations for interaction of a similar distance for the same level. Rather, it references calculations previously made for the similar interaction, thereby eliminating the calculation and storage of information that is the same as information previously calculated and stored.

The present invention is embodied in a method for calculating coefficients representative of a group interaction in an electromagnetic simulation. The method includes the steps of selecting a level including a number of groups; selecting a first group from the level; selecting a far group from a number of far groups located a distance from the first group; and determining if similar coefficients representing the interaction of one of the number of groups and one of the number of far groups for the selected level and the distance between the first group and the far group have been previously calculated. Alternatively, the method of the present invention may use cosine expansion coefficients or other trigonometric expansion coefficients.

The present invention may also be embodied in an apparatus for calculating coefficients representative of group interactions in an electromagnetic simulation. The apparatus includes a memory and a processor. The processor is programmed to select a level including a number of groups; select a first group from the level; select a far group from a number of far groups located a distance from the first group; and determine if similar coefficients representing the interaction of one of the plurality of groups and one of the plurality of far groups for the selected level and the distance between the first group and the far group have been previously calculated and stored in the memory.

The invention itself, together with further objects and attendant advantages, will best be understood by reference to the following detailed description, taken in conjunction with the accompanying drawings.

DESCRIPTION OF THE PREFERRED EMBODIMENT

When using the Fast Multipole Method (FMM), translation operators must be calculated and stored for each pair of groups that interact. For each translation operator calculated according to Equation 2, $2L_l^2$ terms must be stored, wherein $2L_l^2$ is the size of a translation operator at level l. It can be appreciated that simulations requiring x translation operators will require the storage and calculation of $x2L_l^2$ terms.

However, according to the present invention, the translation operator may be represented as a cosine expansion, as shown in Equation 5.

$$\tau_{mm'}(\theta) = \sum_{l=0}^{L} \alpha_i \cos(l\theta) \quad (5)$$

Figure 4:
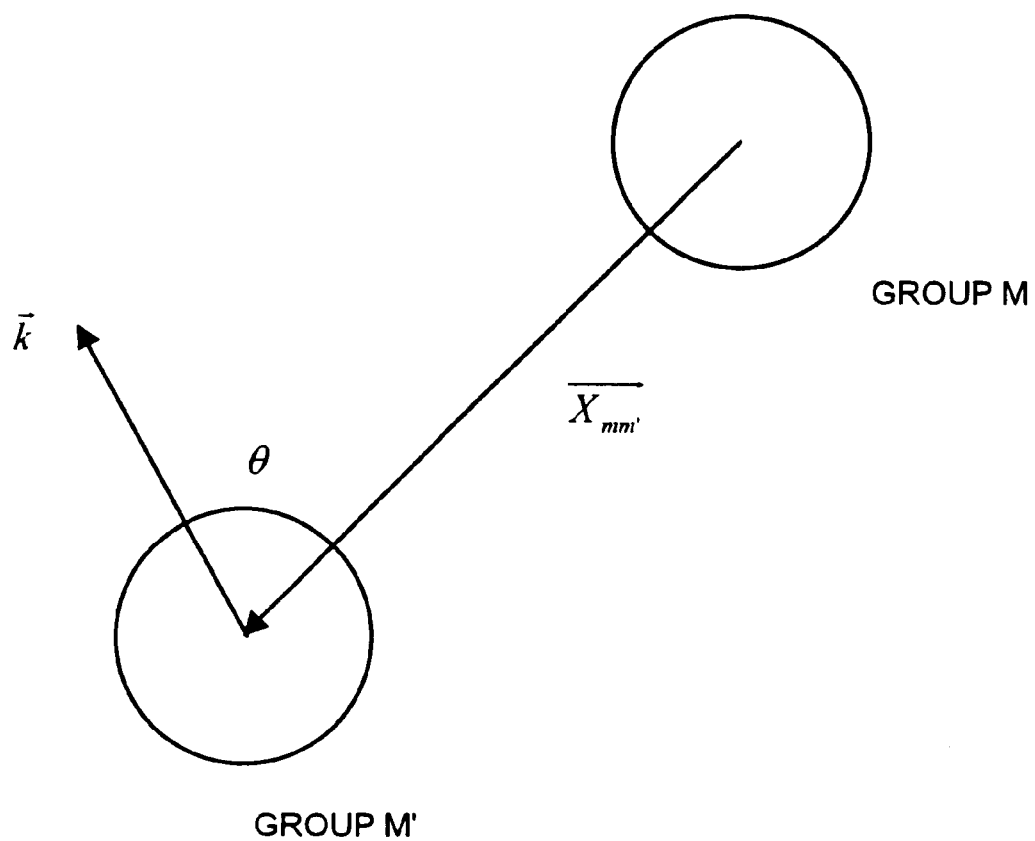
FIG. 4 is an illustration representing the interaction of two groups according to the present invention.

Referring to FIG. 4, an illustration corresponding to the cosine representation of Equation 5 is shown. FIG. 4 illustrates the relationship between groups m and m'. Specifically, $X_{mm'}$ is a vector directed from the center of group m to the center of group m'. Vector $\vec{k}$ represents an abscissa of a sphere quadrature rule used to tabulate the field. Using the cosine representation, only L+1 terms must be stored for each translation operator. The trigonometric expansion coefficients $\alpha_i$ are dependent only on the distance between the groups. Preferably, the trigonometric coefficients are cosine expansion coefficients. The angle between a given abscissa $\vec{k}$ and the vector $X_{mm'}$ is represented by $\theta$. Since $\theta$ is considered only when a FMM is used to calculate a field, if two group pairs have the same separation distance, a single translation operator may be used to represent the relationship between the two groups regardless of their orientation. Storing only a single translation operator that represents multiple group pairs results in additional storage savings. Additional detail regarding the trigonometric expansion representation of the translation operator can be found in M. Stalzer, V. Rokhlin, *Scalability of the Fast Multipole Method for the Helmholtz Equation*, from the $8^{th}$ SIAM Conference on Parallel Processing for Scientific Computing, Mar. 14–17, 1997, the entire disclosure of which is incorporated herein by reference.

Figure 1:
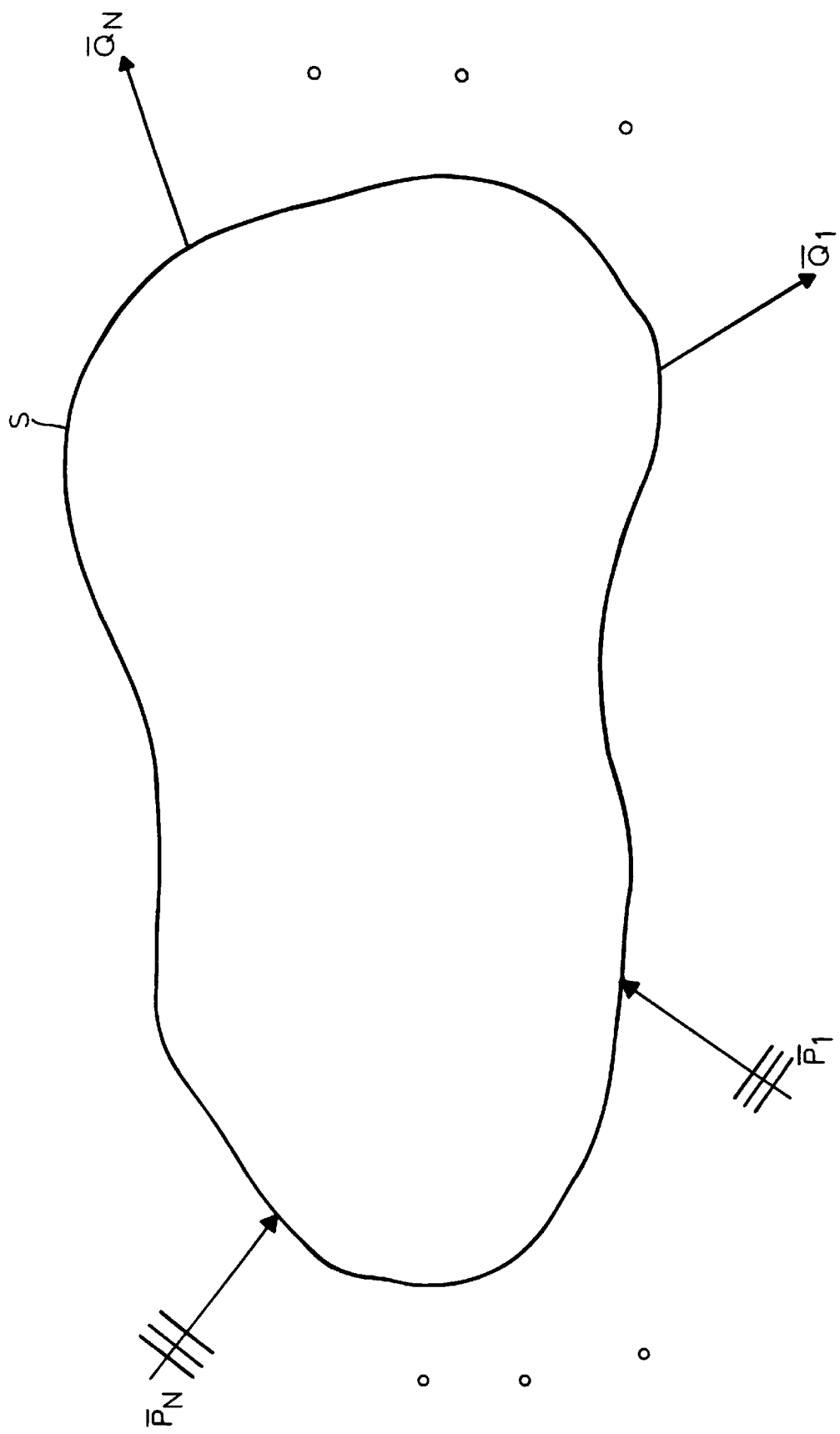
FIG. 1 is a diagrammatic illustration of a scatterer S being irradiated with plane waves P and reradiating fields Q.
Figure 2:
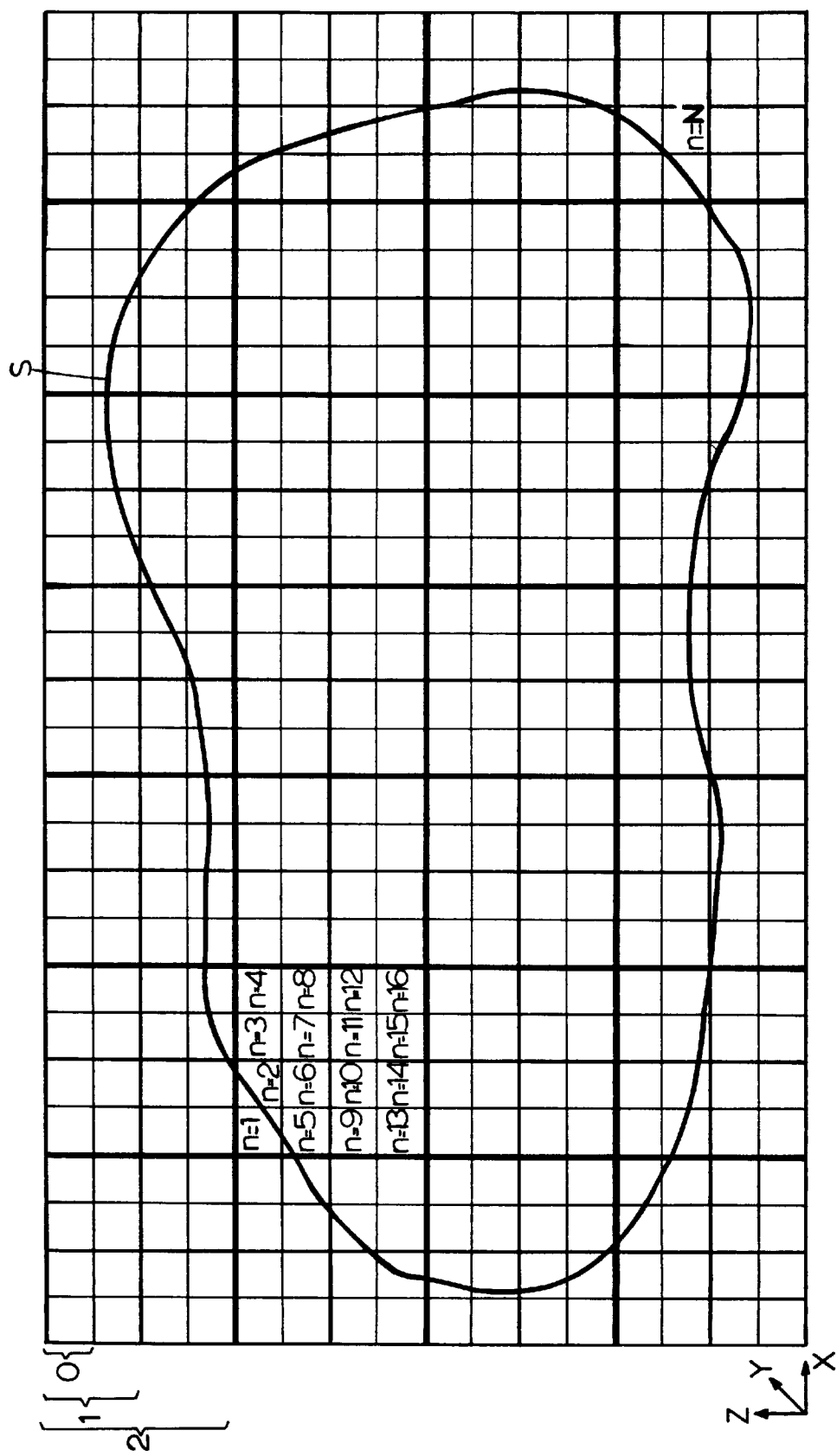
FIG. 2 shows a scatterer S segmented into a number of sections for use in performing general computational methods.

The method of the present invention uses a hierarchical grouping structure to minimize the amount of storage and the number of calculations needed to model the electromagnetic characteristics of a scatterer. The method considers only cells and groups that contain boundary sections of the scatterer. For example, as shown in FIG. 2, cells n=1, n=2, and n=5 and their associated hierarchical groups would be considered because the boundary of the cross section passes through them. Conversely, cells n=7 to n=16 would not be considered.

Figure 5:
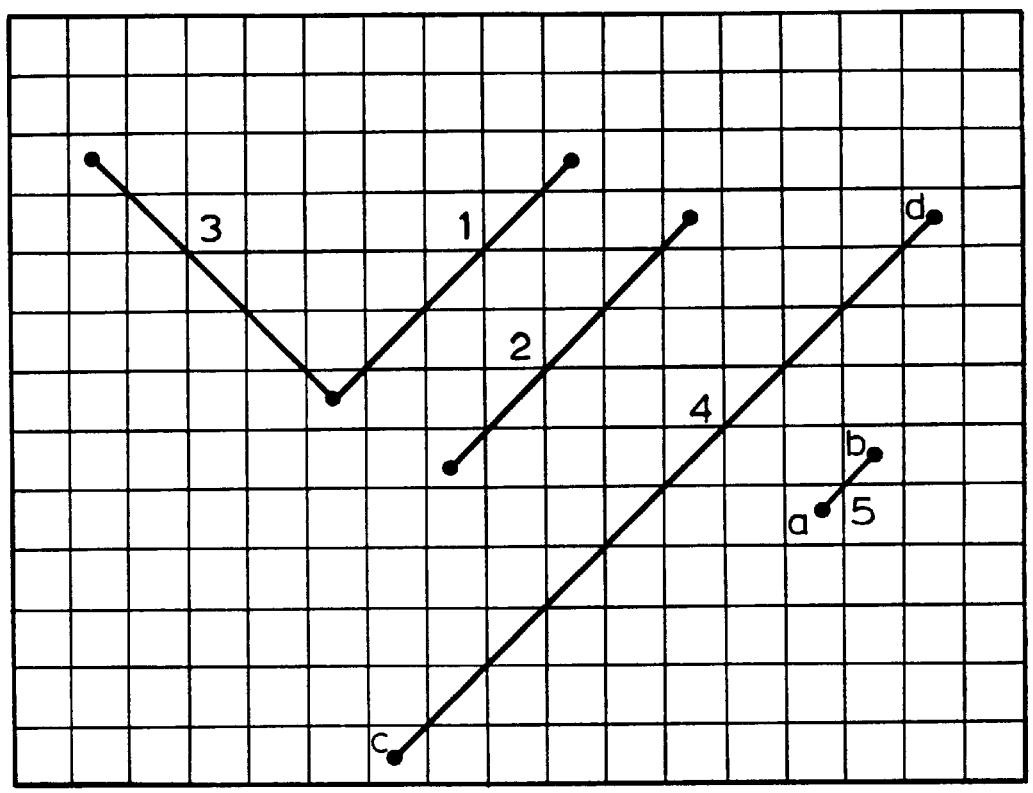
FIG. 5 is a diagram illustrating how group interactions are handled according to the present invention.

FIG. 5 is a diagram illustrating how group interactions are handled by the method of the present invention. Each square shown in FIG. 5 represents a group. Lines 1–5 represent translation operators, which model interactions between the groups. The present invention avoids calculating and storing translation operators for groups that are separated by the same distance as groups for which translation operators have already been calculated, regardless of the orientation of the groups. For example, the present invention uses a single translation operator to represent lines 1–3. Additionally, the present invention handles different group interactions at different levels in the hierarchical structure. For example, interactions between groups a and b would be handled at a lower level than the interactions between groups c and d.

Figure 6:
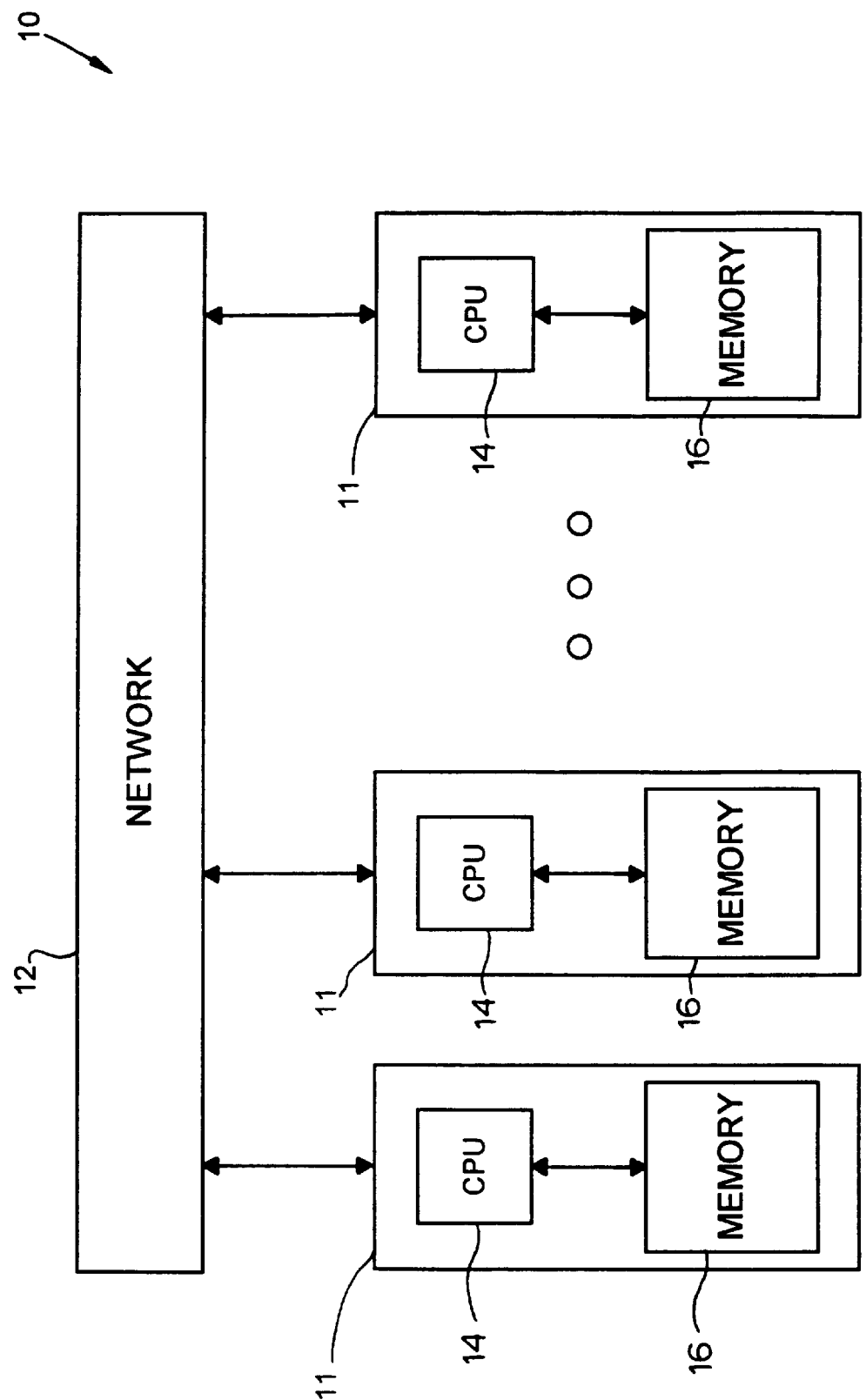
FIG. 6 is an illustration of a processing system that may implement the method of the present invention.

The method of the present invention may be implemented on a variety of processing architectures. One example is a parallel processor configuration 10 shown in FIG. 6. As illustrated, the configuration 10 includes a plurality of asynchronously executing processors 11 in communication with one another via a communications network 12. Each processor 11 generally includes at least a CPU 14 and a memory 16. In performing "parallel processing", the software functions or processes that are associated with a particular task and/or computation are divided and distributed among the various processors 11 connected via the network 12. Additionally, the particular task or computation may require that the processors 11 share information with each other via the network 12. Alternatively, the method of the present invention may be implemented on a system that is not a parallel system. A system such as this may be represented as a single processor 11 shown in FIG. 6.

Figure 3:
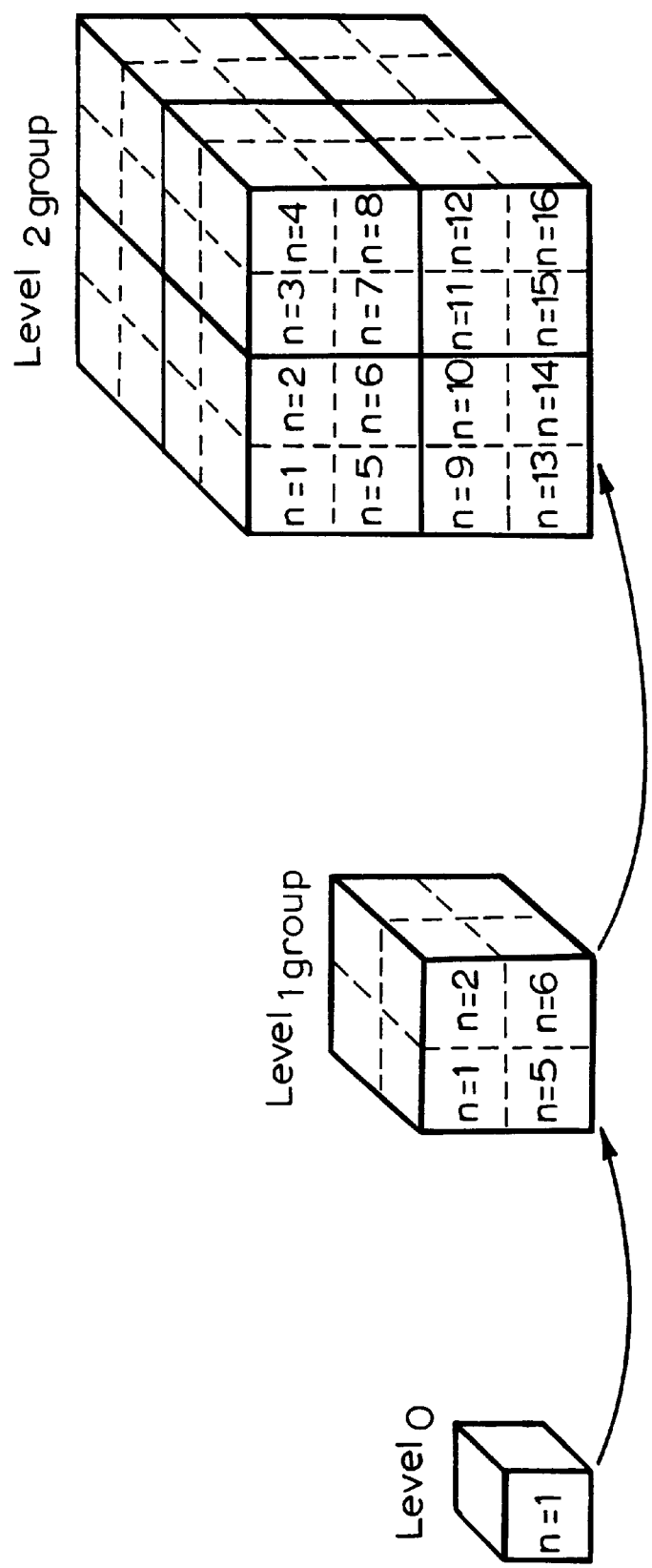
FIG. 3 shows a hierarchical grouping structure that is preferably used in the present invention.
Figure 7A:
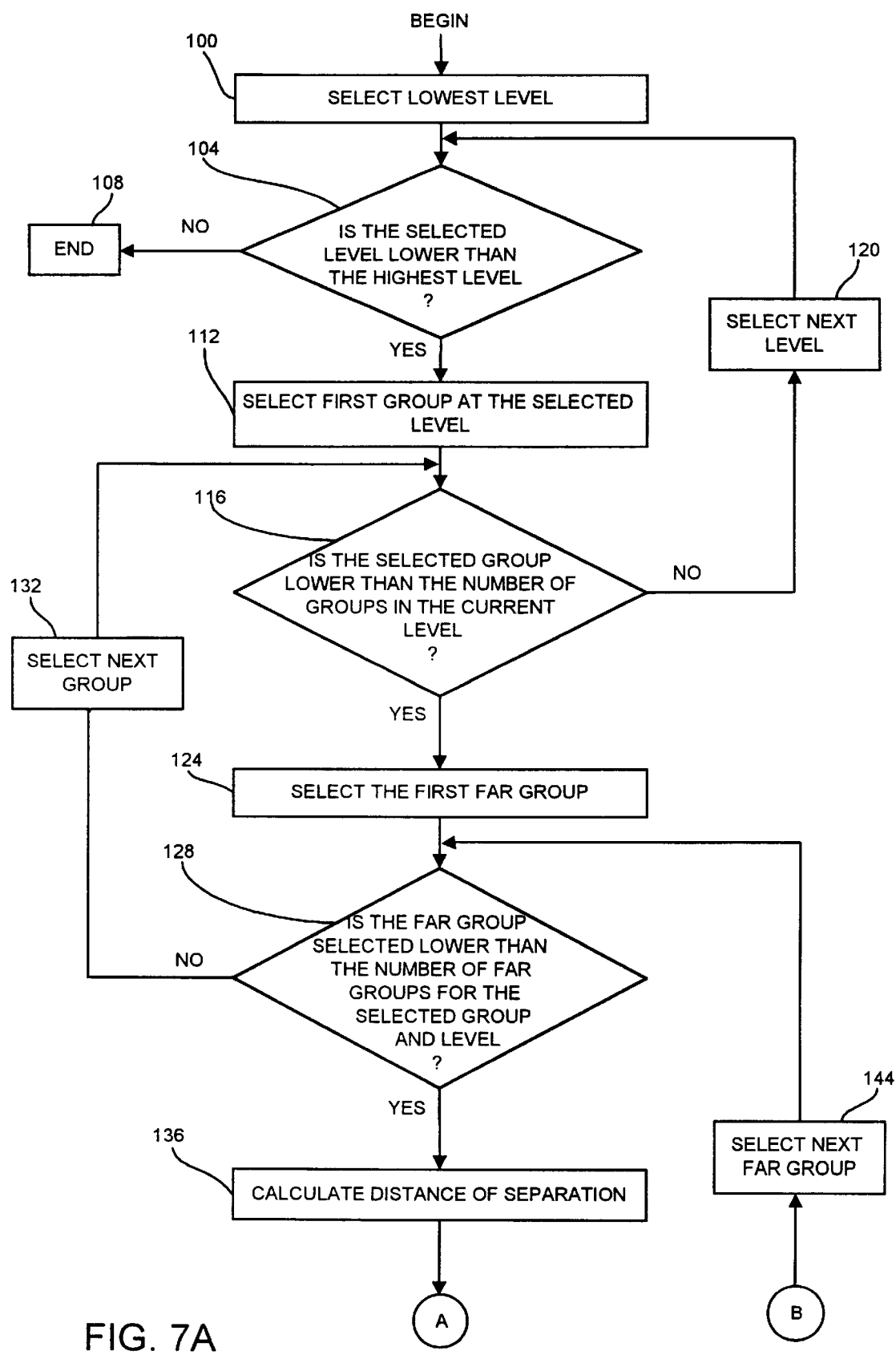
FIGS. 7A and 7B are flow diagrams illustrating the method of the present invention.
Figure 7B:
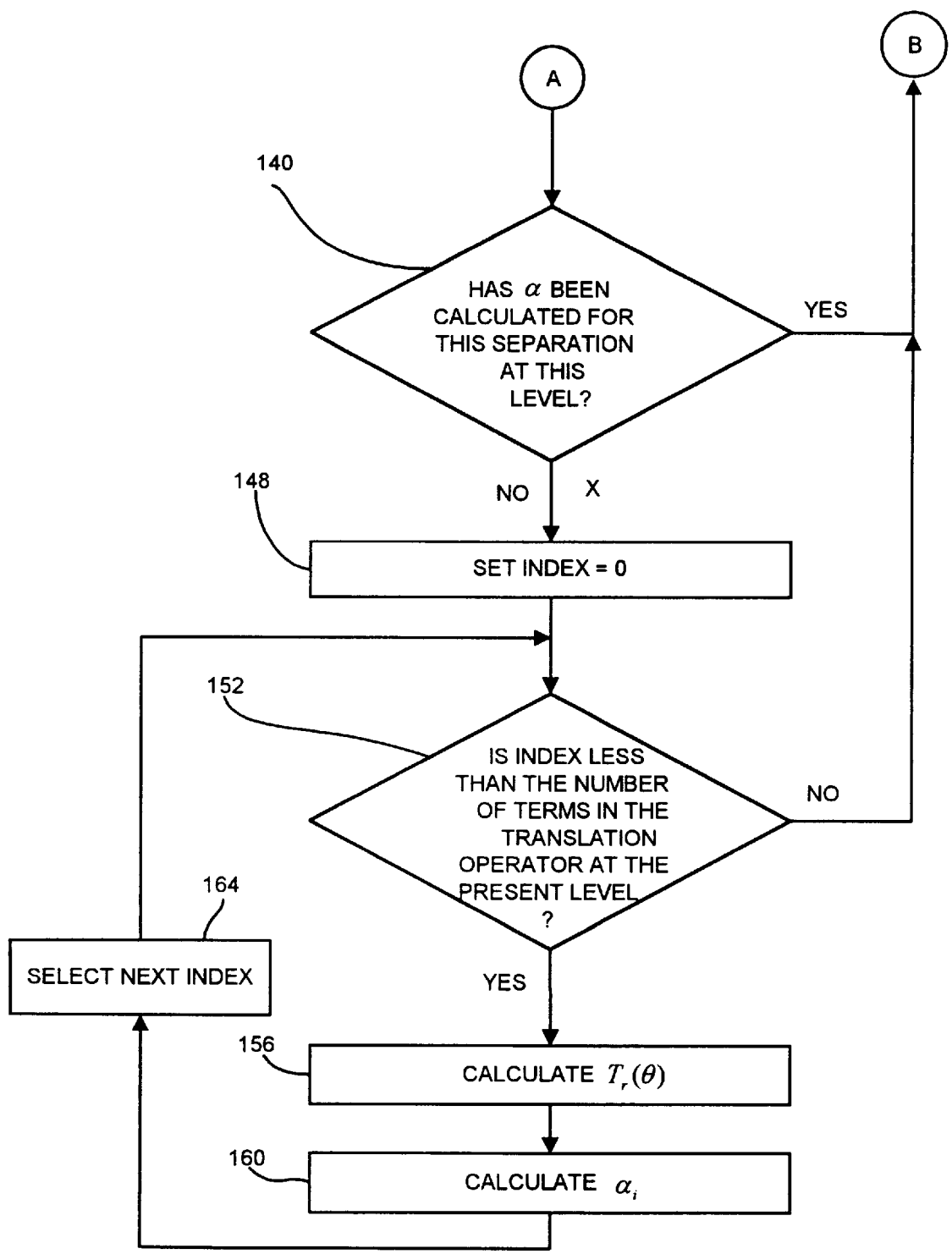

The key to calculating the cosine representation of the Translation operators is the calculation and storage of the expansion coefficients $\alpha_i$. FIG. 7 is a flow diagram representing a method for calculating and storing $\alpha_i$. The method shown in FIG. 7 avoids repeat calculation of $\alpha_i$ terms that have been previously calculated. Efficient calculation of the $\alpha_i$ terms is dependent on a multilevel structure as described in conjunction with FIGS. 2 and 3. Specifically, a scatterer may be broken into various levels, each level having a number of groups. Each group considered has a number of groups that are located relatively far from the considered group. When considering a fixed number of cells in a scatterer, the higher a particular level is, the fewer groups that level will contain because each of the groups at that level is larger.

The method of the present invention operates by selecting levels and, for each selected level, considering all groups within that level. For each group considered the present invention examines all groups that are far from the considered group and calculates cosine expansion coefficients of the translation operator for each group interaction. Groups are considered far from one another if $k_o r \geq L_l$. Wherein, $k_o$ is the wave number, r is the separation distance between the groups, and $L_l$ is the number of terms in the translation operation.

Returning to FIG. 7, a block 100 selects the lowest level of the scatterer structure (e.g., level 0). A block 104 checks to see if the level selected is lower than the highest level of the structure for the scatterer. If the selected level is equal to the highest level of the structure, control is passed to a block 108, which ends the method of the present invention. However, if the selected level is lower than the highest level of the structure, control is passed to a block 112. Block 112 selects the first group from a number of groups at the selected level. Note that for purposes of the lowest level, block 112 selects the first cell and not the first group.

A block 116 tests to see if the selected group is less than the number of groups in the selected level. Block 116 is a program control flow block that checks to see if all groups in the selected level have been evaluated. If the selected group is not less than the number of groups in the selected level (i.e., all groups in the level have not been evaluated), control is passes to a block 120, which selects the next highest level for consideration and passes control back to block 104. Together block 104, 112, 116, and 120 form a first loop, which considers the level structure of the scatterer. Specifically, the first loop steps through all levels as the method of the present invention executes.

If block 116 determines that the selected group is less than the number of groups in the current level (i.e., there are more groups to be evaluated in the present level), control passes to block 124. Block 124 selects the first far group with respect to the present group and present level. Control then passes to block 128, which determines if the far group selected is less than the number of far groups for the selected group and level. Block 128 is a program control block that checks to see if all far groups have been evaluated for the selected group and level. If the far group selected is not less than the number of far groups (i.e., all far groups have been considered), control passes to block 132, which selects the next group for consideration and passes control back to block 116. Blocks 116, 124, 128, and 132 form a second loop. The second loop iterates over all groups for each selected level.

If the far group selected is less than the number of far groups (i.e., all far groups have not been considered), control passes to block 136, which calculates the distance of separation between the selected group and the selected far group. Preferably this calculation is performed using Equation 6.

$$r = |\text{groups}(l,m)x - \text{groups}(l,m)\text{far}(m')x| \qquad (6)$$

Wherein, the first term is the center of the selected group m at the selected level l and the second term represents the center of a far group m' from the selected group m at the selected level l.

After the distance of separation (r) is calculated, control passes to block 140. Block 140 determines whether $\alpha_i$ has been calculated for the selected level and the particular distance of separation. If $\alpha_i$ has been calculated for the selected level and distance, control passes to block 144, which selects the next far group for consideration. Blocks 128, 136, 140, and 144 form a third loop, which considers all far groups for a particular level selected by the first loop and a particular group selected by the second loop.

If the coefficient $\alpha_i$ has not been calculated, control passes from block 140 to a block 148. Block 148 sets the coefficient index to zero and passes control to a block 152. Block 152 tests to see if the coefficient index selected is less than the number of terms in the translation operator at the present level. If the coefficient index is not less, control is passed to block 144, which selects the next far group. However if the coefficient index is less than the number of translation operators in the present level, control passes to a block 156. Block 156 calculates the translation operator for a distance r according to equation 7.

$$Tr(\theta) = \sum_{j=1}^{j=L_l} i^j(2^j+1)h_j^{(l)}(k_0 r)P_j(\cos\theta) \tag{7}$$

Wherein $L_l$ represents the number of terms in the translation operator at the level l.

After the translation operator is calculated, control passes from block 156 to block 160. Block 160 calculates the coefficient $\alpha_i$ according to Equation 8. Alternatively, the translation operator may be calculated while the integral in Equation 8 is calculated.

$$\alpha_i = \int_0^\pi \cos(i\theta)Tr(\theta)d\theta \tag{8}$$

Preferably, the integral associated with Equation 8 is calculated using a trapezoidal quadrature with $2L_l$ nodes.

After the coefficient $\alpha_i$ is calculated by Block 160 for a particular index, control passes to a block 164. Block 164 increments the index of the coefficient and passes control back to block 152. A fourth loop is formed by blocks 152, 156, 160, and 164. The fourth loop calculates all coefficients for the levels, groups, and far groups specified in loops one, two, and three.

The method of the present invention results in a dramatic savings when storing translation operators. This savings is due to the fact that the present invention does not make redundant calculations and store redundant results. The present invention only computes the translation operators needed, and uses a grouping structure to allow for calculation of fewer translation operators. Substantial storage savings is also achieved by representing the coefficients in the form $\alpha_i$ as disclosed. On a problem having 100,000 unknowns, required storage is reduced to approximately 11,000 words, a saving factor of over 16,000 times over traditional translation operator storage and calculation methods.

Of course, it should be understood that a range of changes and modifications can be made to the preferred embodiment described above. For example, the expansions used may be any trigonometric functions. Additionally, the grouping of the level structure does not need to have a box structure. For example, a structure such as three-dimensional hexagons may be used. It is therefore intended that the foregoing detailed description be regarded as illustrative rather than limiting and that it be understood that it is the following claims, including all equivalents, which are intended to define the scope of this invention.

What is claimed is:

1. A method for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the method comprising:

selecting a level from the plurality of levels in the hierarchical and spatial grouping structure;

selecting a first spatial group of cells from the plurality of spatial groups of cells in the selected level;

selecting a first far spatial group of cells from a plurality of far spatial groups of cells located a distance from the first spatial group of cells;

calculating a separation distance between the first spatial group of cells and the selected first far spatial group of cells;

determining if trigonometric coefficients of a translation operator for use in the fast multipole method for the selected level and for the separation distance have been previously calculated and stored; and using the fast multipole method to calculate electromagnetic fields that are the scattering characteristics of the electromagnetic scatterer, the fast multipole method using the previously calculated and stored trigonometric coefficients of the translation operator for the selected level and for the separation distance.

2. The method of claim 1, further comprising the step of calculating and storing trigonometric coefficients of the translation operator for the selected level and for the separation distance if trigonometric coefficients of the translation operator for the selected level and for the separation distance have not been previously calculated.

3. The method of claim 1, wherein the trigonometric coefficients of the translation operator for the selected level and for the separation distance comprise cosine expansion coefficients.

4. A method for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the method comprising:

selecting a level from the plurality of levels in the hierarchical and spatial grouping structure;

selecting a first spatial group of cells from the plurality of spatial groups of cells in the selected level;

selecting a far spatial group of cells from a plurality of far spatial groups of cells located a separation distance from the first spatial group of cells;

determining if trigonometric coefficients of a translation operator for use in the fast multipole method for the selected level and for the separation distance have been previously calculated and stored;

calculating and storing trigonometric coefficients of the translation operator for use in the fast multipole method for the selected level and for the separation distance when no trigonometric coefficients of the translation operator for the selected level and for the distance of separation have been previously stored; and using the fast multipole method to calculate electromagnetic fields that are the scattering characteristics of the electromagnetic scatterer, the fast multipole method using the previously calculated and stored trigonometric coefficients of the translation operator for the selected level and for the separation distance.

5. The method of claim 4, wherein the trigonometric coefficients of the translation operator for the selected level and for the separation distance comprise cosine expansion coefficients.

6. The method of claim 4, further comprising the step of calculating and storing the trigometric coefficients representative of scattering characteristics of an electromagnetic interaction between the first spatial group and the selected far spatial group if the trigometric coefficients representative of scattering characteristics of an electromagnetic interaction between one of the plurality of far spatial groups for the selected level and for the separation distance have not been previously calculated.

7. A method for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the method comprising:

selecting a level from the plurality of levels in the hierarchical and spatial grouping structure;

selecting a first spatial group of cells from the plurality of spatial groups of cells in the selected level;

selecting a far spatial group of cells from a plurality of far spatial groups of cells located a distance from the first spatial group of cells;

calculating a separation distance between the first spatial group of cells and the selected first far spatial group of cells;

determining if trigonometric coefficients of a translation operator for use in the fast multipole method for the selected level and for the separation distance have been previously calculated and stored;

calculating and storing the trigonometric coefficients of a translation operator for use in the fast multipole method, if the trigonometric coefficients of a translation operator for use in the fast multipole method for the selected level and for the separation distance have not been previously calculated; and using the fast multipole method to calculate electromagnetic fields that are the scattering characteristics of the electromagnetic scatterer, the fast multipole method using previously calculated and stored trigonometric coefficients of the translation operator for the selected level and for the separation distance.

8. An apparatus for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the apparatus comprising:

a memory; and a processor programmed to perform the steps of:

selecting a level from the plurality of levels in the hierarchical and spatial grouping structure;

selecting a first spatial group of cells from the plurality of spatial groups of cells in the selected level;

selecting a first far spatial group of cells from a plurality of far spatial groups of cells located a separation distance from the first spatial group of cells;

determining if trigonometric coefficients of a translation operator for use in the fast multipole method for the selected level and for the separation distance have been previously calculated and stored; and using the fast multipole method to calculate electromagnetic fields that are the scattering characteristics of the electromagnetic scatterer, the fast multipole method using previously calculated and stored trigonometric coefficients of the translation operator for the selected level and for the separation distance.

9. The apparatus of claim 8, wherein the processor is further programmed to calculate and store the trigonometric coefficients of the translation operator for the selected level and for the separation distance, if the trigonometric coefficients of the translation operator for the selected level and for the separation distance have not been previously calculated.

10. The apparatus of claim 8, wherein the trigonometric coefficients of the translation operator for the selected level and for the separation distance comprise cosine expansion coefficients.

11. An apparatus for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the apparatus comprising:

a memory; and a processor programmed to perform the steps of:

selecting a level from the plurality of levels in the hierarchical and spatial grouping structure;

selecting a first spatial group of cells from the from the plurality of spatial groups of cells in the selected level;

selecting a far spatial group of cells from a plurality of far spatial groups of cells located a separation distance from the first spatial group of cells;

determining if trigonometric coefficients of a translation operator for use in the fast multipole method for the selected level and for the separation distance have been previously calculated and stored;

calculating and storing trigonometric coefficients of the translation operator for use in the fast multipole method for the selected level and for the separation distance, when no trigonometric coefficients of the translation operator for the selected level and for the distance of separation have been previously stored; and using the fast multipole method to calculate electromagnetic fields that are the scattering characteristics of the electromagnetic scatterer, the fast multipole method using the previously calculated and stored trigonometric coefficients of the translation operator for the selected level and for the separation distance.

12. The apparatus of claim 11, wherein the trigonometric coefficients of the translation operator for the selected level and for the separation distance comprise cosine expansion coefficients.

13. An apparatus for calculating and efficiently storing trigonometric coefficients of translation operators used by a fast multipole method to model scattering characteristics of an electromagnetic scatterer simulated using a plurality of cells that are grouped into a hierarchical and spatial grouping structure having a plurality of levels, wherein each level has a plurality of spatial groups of cells, the apparatus comprising:

a memory; and a processor programmed to perform the steps of:

selecting a level from the plurality of levels in the hierarchical and spatial grouping structure;

selecting a first spatial group of cells from the from the plurality of spatial groups of cells for the selected level;

selecting a far spatial group of cells from a plurality of far spatial groups of cells located a separation distance from the first group of cells;

determining if trigonometric coefficients of a translation operator for use in the fast multipole method for the selected level and for the separation distance have been previously calculated and stored, wherein the trigonometric coefficients comprise cosine expansion coefficients;

calculating and storing trigonometric coefficients of the translation operator for use in the fast multipole method for the selected level and for the separation distance if trigonometric coefficients of the translation operator for the selected level and for the distance of separation have not been previously calculated; and using the fast multipole method to calculate electromagnetic fields that are the scattering characteristics of the electromagnetic scatterer, the fast multipole method using the previously calculated and stored trigonometric coefficients of the translation operator for the selected level and for the separation distance.

* * * * *